United States Patent [19]

Katoh et al.

[11] Patent Number: 5,169,792

[45] Date of Patent: Dec. 8, 1992

[54] SEMICONDUCTOR DEVICE

[75] Inventors: Katsuto Katoh, Tokyo; Kiyomi Naruke, Yokohama, both of Japan

[73] Assignee: Kabushiki Kaisha Toshiba, Kawasaki, Japan

[21] Appl. No.: 502,027

[22] Filed: Mar. 30, 1990

[30] Foreign Application Priority Data

Mar. 31, 1989 [JP] Japan .................. 1-80409

[51] Int. Cl.⁵ .......................... H01L 29/68
[52] U.S. Cl. .................... 257/398; 257/316
[58] Field of Search .......... 437/45, 47, 48, 49, 437/50, 51, 52, 60, 69, 70; 357/23.5, 23.8, 23.11, 23.12, 45, 49, 23.6, 23.6 G, 41, 47, 48, 50

[56] References Cited

U.S. PATENT DOCUMENTS

| | | | |
|---|---|---|---|
| 3,868,274 | 2/1975 | Hubar et al. | 148/1.5 |
| 4,229,755 | 10/1980 | Custode | 357/23.5 |
| 4,471,373 | 9/1984 | Shimizu et al. | 357/23.5 |
| 4,502,208 | 3/1985 | McPherson | 357/23.5 |
| 4,637,128 | 1/1987 | Mizutani | 148/DIG. 82 |
| 4,701,776 | 10/1987 | Perlegos | 357/23.5 |
| 4,841,481 | 6/1989 | Ikeda | 357/23.5 |

FOREIGN PATENT DOCUMENTS

| | | | |
|---|---|---|---|
| 0127858 | 7/1984 | Japan | 357/23.5 |
| 0156830 | 7/1986 | Japan | 357/50 |
| 2080024A | 1/1982 | United Kingdom | |

Primary Examiner—Tom Thomas
Attorney, Agent, or Firm—Foley & Lardner

[57] ABSTRACT

An improvement for a semiconductor device in which memory elements and logic elements are formed on the same substrate is disclosed. The semiconductor device is formed so that a concentration of the field inversion preventive layer below the field oxide film within the region where memory elements are formed is higher than a concentration of the field inversion preventive layer below the field oxide film within the region where logic elements are formed. For the method of manufacturing a semiconductor substrate according to this invention which realizes such a structure, there is a method of allowing the concentrations of field inversion preventive layers within the memory element region and within the logic element region to be differently changed, respectively, and a method of first forming field inversion preventive layers within the both regions so that they have a low concentration, and implementing ion-implantation only to the memory element region for a second time under the state where the logic element region is covered with resist, to thus provide an inversion preventive layer of high concentration.

1 Claim, 7 Drawing Sheets

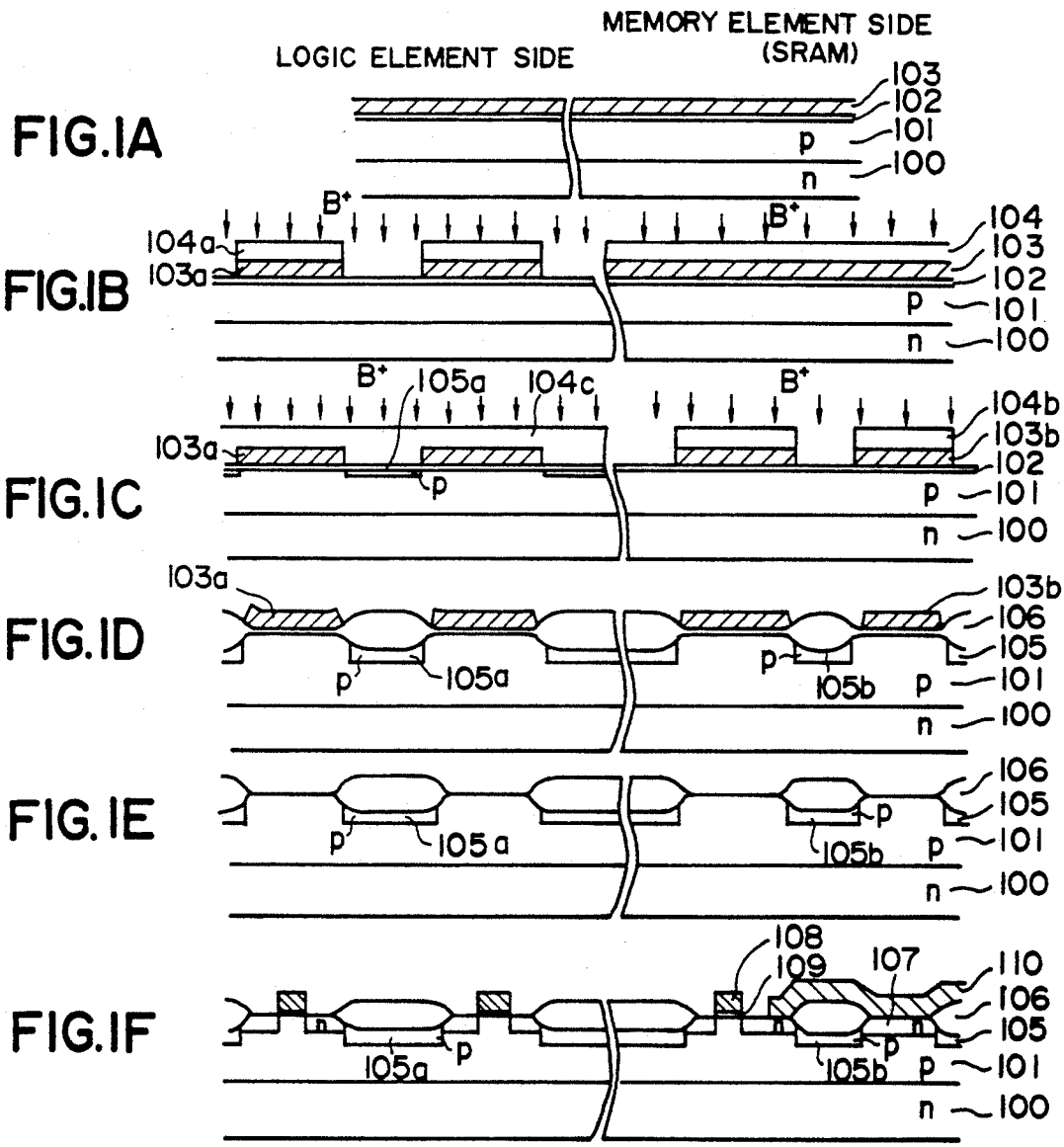

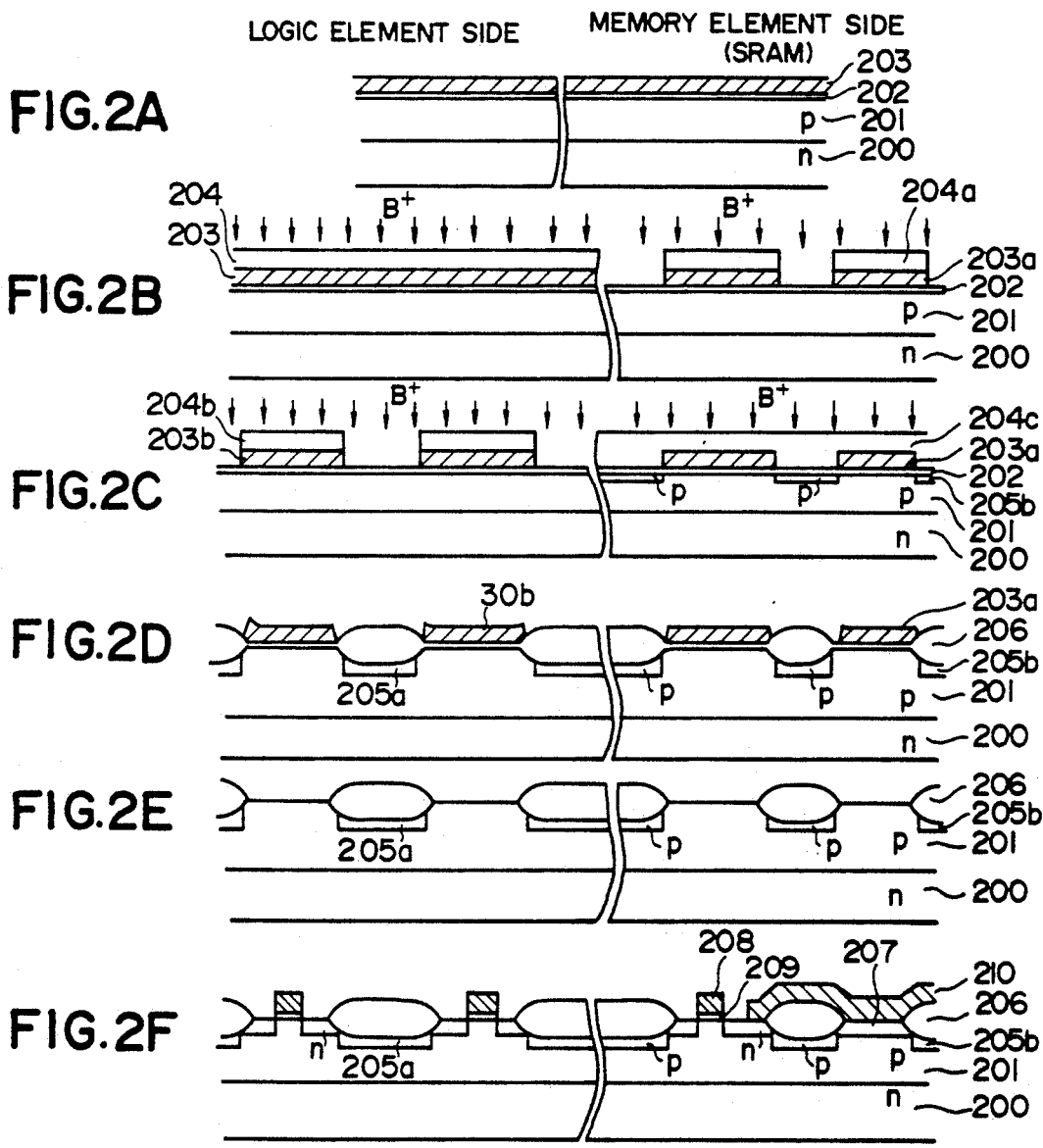

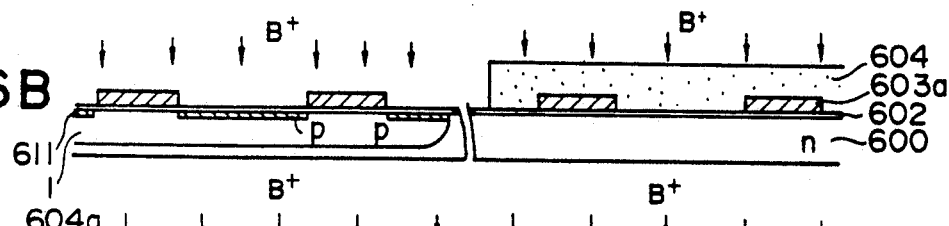
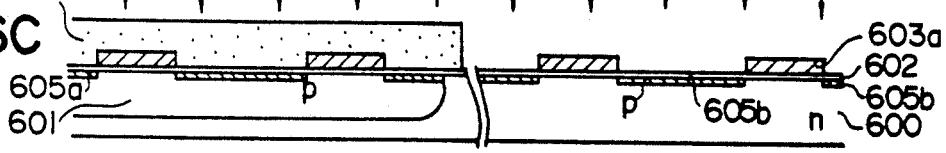
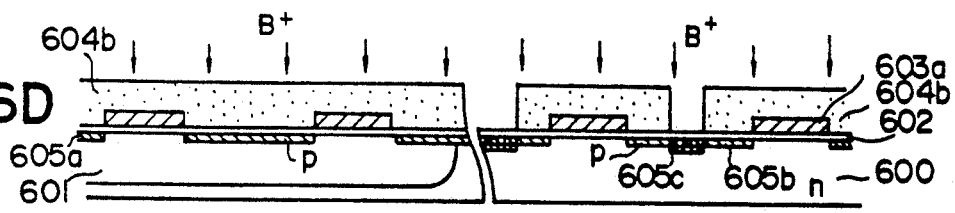
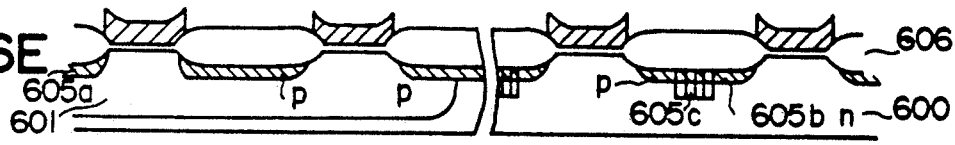
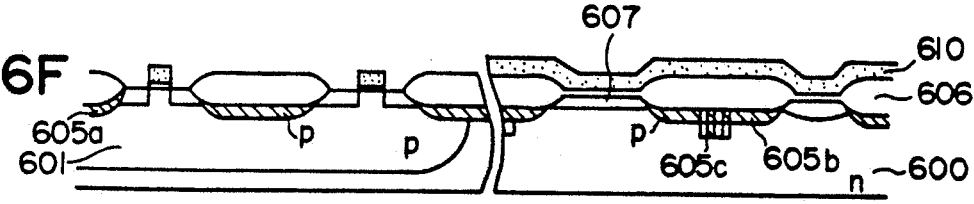

SEMICONDUCTOR DEVICE

BACKGROUND OF THE INVENTION

This invention relates to a semiconductor device and a method of manufacturing the same, and more particularly to a semiconductor device including a plurality of logic elements and memory elements formed on the same substrate, and a method of manufacturing such a semiconductor device.

Semiconductor devices including logic elements and memory elements formed on the same substrate have been conventionally proposed.

In such conventional semiconductor devices, different problems exist depending upon whether memory elements to be formed on the same substrate as that on which logic elements are formed are of SRAM or DRAM structure, or EPROM or EEPROM structure, respectively.

Initially, where the memory element is SRAM or DRAM structure, since a memory capacity more than a predetermined value (e.g., 256 k bits) is generally required as the memory capacity, it is necessary to allow the element isolation width by the field oxide film to be finer than in the case of the logic element. To realize this, the impurity concentration of the field inversion preventive layer must be higher than that in the case of forming only logic elements in order to prevent a punch-through. Thus, a field inversion preventive layer having a high concentration will be also formed on the logic element side.

However, when such a field inversion preventive layer having a high concentration is formed on the logic element side in this way, a large electric capacitor is formed between element formation region and the field inversion preventive layer adjacent to each other resulting in the problem that the operating oposed on the logic element side is retarded.

On the other hand, also in the case where the memory element is of EPROM or EEPROM structure, a memory capacity more than a predetermined value is similarly required. For this reason, the impurity concentration of the field inversion preventive layer must be higher than that in the case of forming only logic elements on the substrate. However, since a junction withstand voltage capable of withstanding a high program voltage is required at the same time, it is necessary to lower the impurity concentration of the portion adjoining the device formation region of the field inversion preventive layer. Accordingly, the impurity concentration of the field inversion preventive layer in this case must be lower than that in the case of forming only logic elements on the substrate at the portion adjoining the device formation region, and must be higher than that in the same case as above at the central portion which does not adjoin the device formation region. However, since both field inversion preventive layers have been conventionally formed at the same time as described above, there is a problem that such layers having different concentrations are unable to be formed.

SUMMARY OF THE INVENTION

Accordingly, an object of this invention is to provide a semiconductor device capable of satisfying characteristics required for respective logic and memory elements of a semiconductor device on which logic elements and memory elements are formed at the same time, and a method of manufacturing such a semiconductor device.

In accordance with the present invention, there is provided a semiconductor device including a plurality of logic elements and memory elements formed on the same substrate, the semiconductor device comprising: a region where the logic elements are formed, including a first field inversion preventive layer having a first impurity concentration below a first field oxide film for isolating the logic elements; and a region where the memory elements are formed, including a second field inversion preventive layer having a second impurity concentration higher than the first impurity concentration below a second field oxide film for isolating said memory elements.

In other word, a semiconductor device according to this invention is directed to a semiconductor device in which memory elements and logic elements are formed on the same substrate, characterized in that the semiconductor device is formed so that a concentration of the field inversion preventive layer below the field oxide film within the region where memory elements are formed is higher than a concentration of the field inversion preventive layer below the field oxide film within the region where logic elements are formed.

In accordance with the present invention, there is provided a method of manufacturing a semiconductor device including a logic element region and a memory element region formed on the same semiconductor substrate, the method comprising: a step of forming, within said logic element region, a first field inversion preventive layer having a first impurity concentration below a first field oxide film for isolating the logic elements; and a step of forming, within the memory element region, a second field inversion preventive layer having a secoond impurity concentration higher than the first impurity concentration below a second field oxide film for isolating the memory elements.

For the method of manufacturing a semiconductor device according to this invention which realizes the above-mentioned structure, there is a method of allowing the concentrations of field inversion preventive layers within the memory element region and within the logic element region to be differently changed, respectively, and a method of first forming field inversion preventive layers within the both regions so that they have a low concentration, and implementing ion-implantation only to the memory element region for a second time under the state where the logic element region is covered with resist, to thus provide an inversion preventive layer of high concentration.

Furthermore, it is preferable that the portion close to memory elements of the inversion preventive layer on the memory element side is allowed to have a concentration lower than that of the inversion preventive layer on the logic element side and the central portion away from the memory elements is allowed to have a concentration higher than that of the inversion preventive layer on the logic element side. This can be performed by varying a mask for ion-implantation at two stages.

Since the first field inversion preventive layer formed below the first field oxide film for isolating logic elements has a first relatively low impurity concentration, the electric capacitor formed between the first field inversion preventive layer and the logic element formation region is small, resulting in no possibility that the operating speed is lowered. On the other hand, since the second field inversion preventive layer formed below the second field oxide film for isolating memory elements has a second impurity concentration higher than the first impurity concentration, punch-through is also prevented in the case where the device solution width of the field oxide film becomes narrow for the purpose of miniaturization.

Furthermore, in the case where the impurity concentration of the portion adjoining the logic element formation region of the second field inversion preventive layer is a third impurity concentration lower than the first impurity concentration, and the portion which does not adjoin the logic element formation region thereof is a second impurity concentration higher than the first impurity concentration, concentration of an electric field between the device formation region and the second field inversion preventive layer is prevented, resulting in an increased junction withstand voltage. In addition, since the impurity concentration is high in the portion which does not adjoin the memory element formation region, the field inversion voltage increases.

Accordingly, the device and the method according to this invention are effective in carrying out descaling and increasing withstand voltage.

BRIEF DESCRIPTION OF THE DRAWINGS

In the accompanying drawings:

FIGS. 1A to 1F are device cross sections showing a sequence of process steps of a method of manufacturing a semiconductor device according to a first embodiment of this invention, respectively, FIGS. 2A to 2F are device cross sections showing a sequence of process steps of a method of manufacturing a semiconductor device according to a second embodiment of this invention, respectively, FIGS. 6A to 6F are device cross sections showing a sequence of process steps of a method of manufacturing a semiconductor device according to a fourth embodiment of this invention, respectively.

DETAILED DESCRIPTION OF THE INVENTION

Figure 3A:
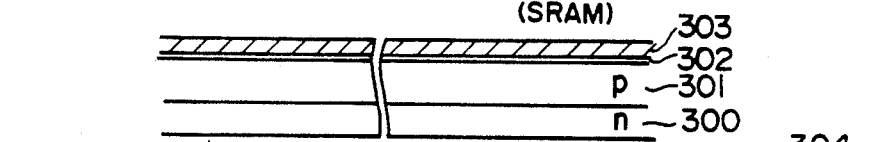
FIGS. 3A to 3F are device cross sections showing a sequence of process steps of a method of manufacturing a semiconductor device according to a third embodiment of this invention, respectively.

Initially, a first embodiment for forming a SRAM as a memory element on the same substrate as that for the CPU as a logic element will be described. FIGS. 1A to 1F are device cross sections showing a sequence of process steps in this case, respectively.

After a p-type well 101 is formed in an n-type semiconductor substrate 100, the surface of the substrate is thermally oxidized at a temperature of 900° C. to form an oxide film 102 having a thickness of 500 Å then form a silicon nitride film 103 by CVD process on the surface thereof (FIG. 1A). A resist 104 is then formed on the entire surface. The device structure thus obtained is subjected to an exposure process. Then, patterning is implemented to the resist portion only on the logic element side. A photolithographic process using the patterned resist as an etching mask is used to implement patterning to the silicon nitride film 103 portion only on the logic element side. Thus, there is formed a silicon nitride film 103a the portion thereof where a field inversion preventive layer is to be formed being removed. It is to be noted that on the memory element side, since the entire surface is covered with the resist 104, no etching process is carried out in effect. Then, boron (B) ions are implanted at a dose of $3 \times 10^{13}$ atoms/cm$^2$ using the silicon nitride film 103a and the resist 104a on the logic element side and the silicon nitride film 103 side and the resist 104 on the memory element as masks (FIG. 1B) to form a field inversion preventive layer 105a only in the logic element side (FIG. 1C).

A field inversion preventive layer is then formed on the memory element side. To realize this, the resist films 104a and 104 are removed once to coat a resist on the entire surface for a second time. The portion on the logic element side is allowed to be covered with a resist 104c. The silicon nitride film 103 is subjected to patterning using a photolithographic process on the memory element side. Thus, there is formed a silicon nitride film 103b the portion thereof where the field inversion preventive layer is to be formed, being removed. Ion-implantation of boron (B) is carried out at a dose of $7 \times 10^{13}$ atoms/cm$^2$ using the silicon nitride film 103b and the resist 104b on the memory element side, and the silicon nitride film 103a element side and the resist 104c on the logic as masks (FIG. 1C). Thus, a field inversion preventive layer 105b is formed only in the memory element side.

After the resist films 104b and 104c are removed, oxidation is carried out in the atmosphere of oxidation. Thus, field oxide films 106 having a thickness of 4000 to 6000 Å are formed within both the device isolation region on the logic element side and that on the memory element side (FIG. 1D).

The silicon nitride films 103b and 103a are then removed (FIG. 1E). The entire surface is thermally oxidized to form an oxide film to deposit thereon polysilicon by CVD process. Then both films are subjected to patterning so that only the gate electrode formation region is left to form gate electrodes 108 of polysilicon and an interconnection 110 (FIG. 1F). At times subsequent thereto, an SRAM is formed within the device formation region on the memory element side and logic elements are formed within the device formation region on the logic element side.

It is to be noted that since the field inversion preventive layer at the boundary portion between the device formation region on the logic element side and that on the memory element side is such that the width of the field oxide film 106 is ordinarily broad, there is no possibility that punch-through may take place. Thus, this field inversion preventive layer may be formed in conformity with the concentration on either side. Alternatively, a method may be employed in which the half on the logic element side of the field inversion preventive layer is formed so that it has a low concentration and the half on the memory element side thereof is formed so that it has a high concentration.

Figure 7:
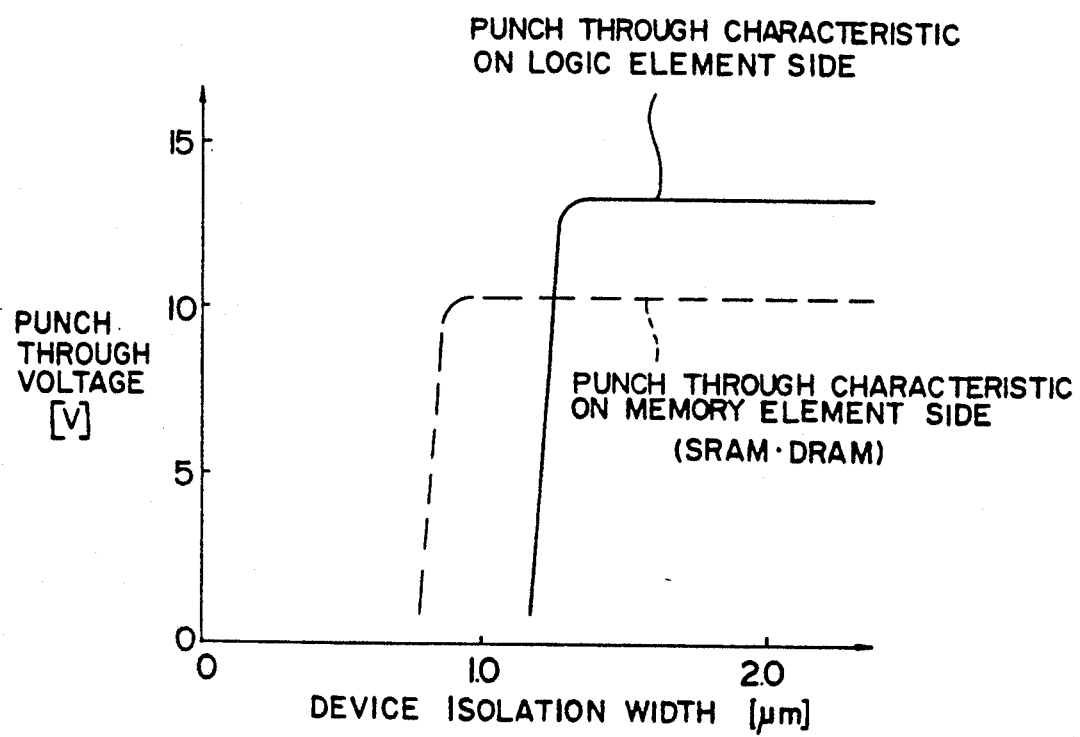
FIG. 7 is an explanatory view showing the relationship between the device isolation width and the punch-through voltage in the semiconductor device of this invention.

As stated above, the field inversion preventive layer on the logic element side and that on the memory element side may be formed in a manner that they have impurity concentrations different from each other. Thus, the field inversion preventive layer on the logic element side is formed so that it has a relatively low impurity concentration, thus preventing an unnecessary electric capacitor from being added to the boundary portion with the device formation region. As a result, lowering of the operating speed can be prevented. On the other hand, as seen from FIG. 7 showing the relationship between the device isolation width and the punch-through voltage, the field inversion preventive layer on the memory element side is formed so that it has an impurity concentration higher than that of the logic element, whereby a high punch-through voltage can be provided and the memory integration can be increased even in the case where a field oxide film narrow in width is formed for the purpose of descaling.

A second embodiment for forming a SRAM on the same substrate as that for CPU in the same manner as in the first embodiment will now be described. FIGS. 2A to 2F are device cross sections showing a sequence of process steps in this case, respectively.

This embodiment differs from the first embodiment in the order in which impurity ions are implanted into the region on the logic element side and that on the memory element side, respectively.

An oxidation film 202 and a silicon nitride film 203 are formed on a substrate 200 (FIG. 2A). Patterning is then implemented to the nitride film 203 using the photolithographic process to form a silicon nitride film 203a the portion thereof where a field inversion preventive layer only on the memory element side is to be formed being removed. Using the silicon nitride film 203a on the memory element side, the silicon nitride film 203 on the logic element side, and resists 204a and 204 formed upon these films as masks, boron (B) ions are implanted at a dose of $7 \times 10^{13}$ atoms/cm$^2$ (FIG. 2B) to form a field inversion preventive layer 205b only on the memory element side (FIG. 2C).

Then, the resist films 204a and 204 are once removed to coat a resist on the entire surface for a second time. The silicon nitride film 203 is subjected to patterning using the photolithographic process to form a silicon nitride film 203b the portion thereof where a field inversion preventive layer on the logic element side is to be formed, being removed. Using the silicon nitride film 203b, the silicon nitride film 203a on the logic element side, and resists 204b and 204c on these films as a mask, boron (B) ions are implanted at a dose of $3 \times 10^{13}$ atoms/cm$^2$ (FIG. 2C) to form a field inversion preventive layer 205a on only on the logic element side.

In a manner similar to the above at subsequent times, after the resist films 204b and 204c are removed, oxidation is carried out in the atmosphere of oxidation to thereby form a field oxide film 206 having a thickness of 4000 to 6000 Å within both the device isolation region on the logic element side and that on the memory element side (FIG. 2D).

After the silicon nitride films 203b and 203a are removed in the same manner as in the first embodiment (FIG. 2E), a SRAM is formed within the device formation region on the memory element side and a CPU is formed within that on the logic element side.

FIGS. 3A to 3F are device cross sections showing a sequence of process steps according to a third embodiment, respectively. This embodiment is characterized in that ion-implantation is first implemented at a low dose to the regions forming the both field inversion preventive layers thereafter to implement an ion-implantation at a higher dose only to the region on the memory element side for a second time.

Figure 3B:
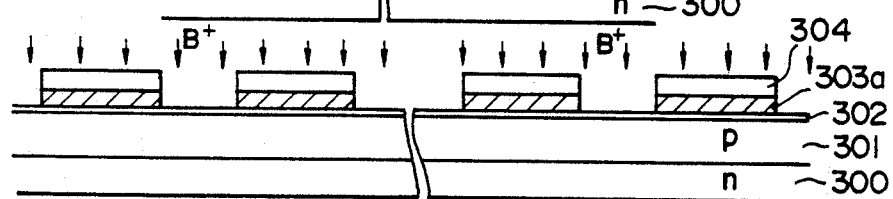
Figure 3C:
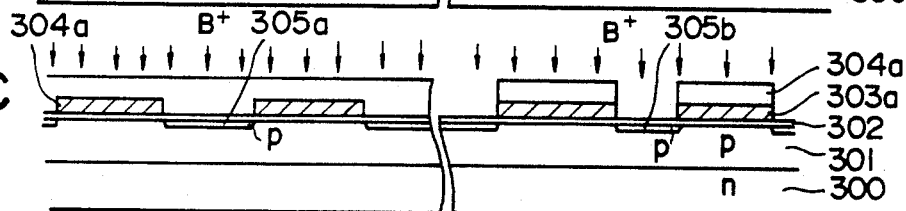

An oxidation film 302 and a silicon nitride film 303 are formed on the surface of a semiconductor substrate 300 (FIG. 3A). The silicon nitride film 303 on the memory element side and that on the logic element side are subjected to patterning using the photolithographic process to form a silicon nitride film 303a portion thereof where a field inversion preventive layer is to be formed, being removed. Using the silicon nitride film 303a and resist film 304 as a mask, boron (B) ions are implanted at a dose of $3 \times 10^{13}$ atoms/cm$^2$ (FIG. 3B). Field inversion preventive layers 305a and 305b are formed within the field oxidation formation region on the logic element side and that on the memory element side so that they have the same impurity concentration, respectively.

The resist film 304 is then removed once to coat a resist on the entire surface for a second time. The resist film thus coated is subjected to patterning by the same pattern as above on only the memory element side to form a resist film 304a the portion thereof where a field inversion preventive layer is to be formed, being removed. Using the resist film 304a and the silicon nitride film 303a as a mask, boron (B) ions are implanted at a dose of $4 \times 10^{13}$ atoms/cm$^2$ (FIG. 3C), thus allowing only the field inversion preventive layer 305b on the memory element side to have a high impurity concentration.

Figure 3D:
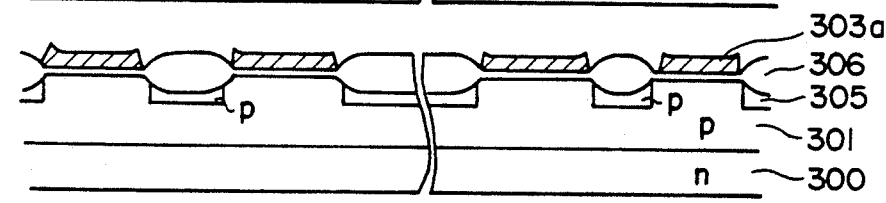
Figure 3E:
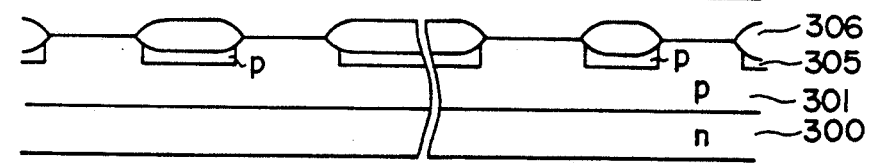
Figure 3F:
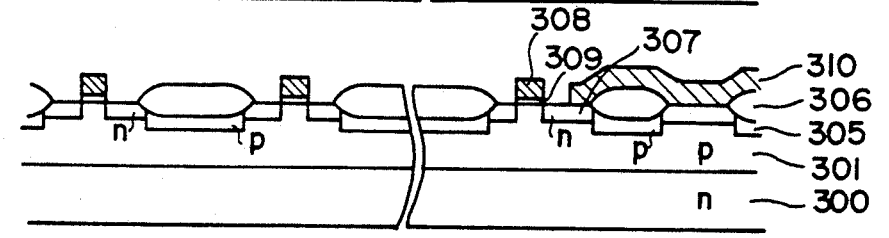

At times subsequent thereto, in the same manner as in the first and second embodiments, a field oxidation film 306 having a thickness of 4000 to 6000 Å is formed within the device isolation region (FIG. 3D). After the silicon nitride film 303a is removed (FIG. 3E), a SRAM is formed on the memory element side and a CPU is formed on the logic element side (FIG. 3F).

Figure 4:
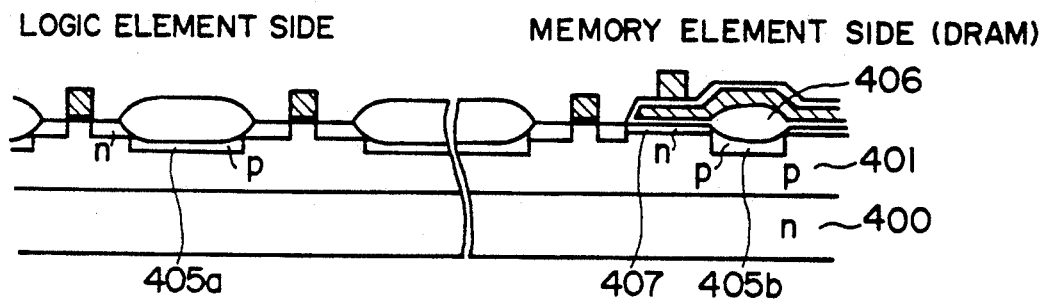
FIG. 4 is a device cross section showing a process steps of a method of manufacturing a semiconductor device according to a further embodiment of this invention.

FIG. 4 shows a cross sectional view in the case where a DRAM as the memory element is formed on the same substrate as that for CPU wherein a diffused layer for an n-type capacitor is formed within a DRAM formation region. By using any one of the methods of the above-described first to third embodiments it is possible to form a field inversion preventive layer 405a having a low impurity concentration on the logic element side, and to form a field inversion preventive layer 405b having a high impurity concentration on the memory element side.

Figure 5:
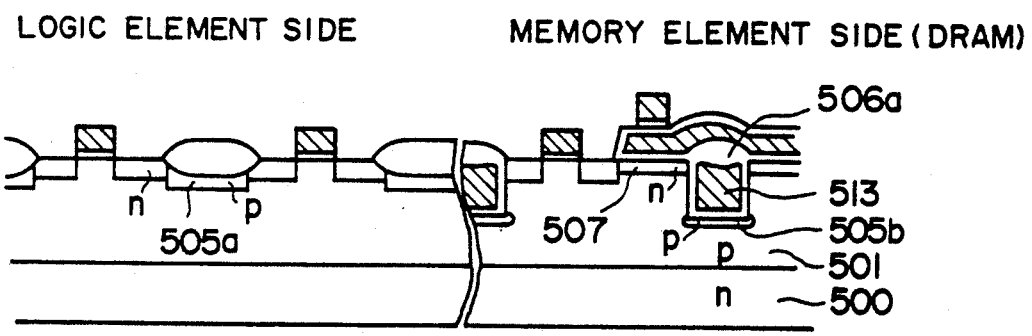
FIG. 5 is a device cross section showing a process step of a method of manufacturing a semiconductor device according to a further different embodiment of this invention.

FIG. 5 shows an embodiment where a DRAM as the memory element is formed in the same manner as in the case of FIG. 4. This embodiment differs from the embodiment of FIG. 4 only in that not only a field inversion preventive layer 505a but also a trench buried polysilicon 513 are formed below a field oxide film 506a on the memory element side. Also in this case, by using any one of the methods of the above-described first to third embodiments, it is possible to form a field inversion preventive layer 505a having a low impurity concentration on the logic element side, and to form a field inversion preventive layer 505b having a high impurity concentration on the memory element side.

A fourth embodiment for forming an EEPROM as the memory element simultaneously with formation of a CPU will now be described. In this case, unlike the first to third embodiments, the field inversion preventive layer on the memory element side is formed in a manner that a portion adjoining the device formation region and a portion which does not adjoin it have impurity concentrations different from each other.

FIGS. 6A to 6F are device cross sections showing a sequence of process steps in this case, respectively. In this embodiment, a p-type well 601 is formed only on the logic element side of a p-type semiconductor substrate 600. This is because logic elements are formed in the state of the semiconductor substrate 600 having a low concentration impurity in order to eliminate a voltage drop. Other process steps will be implemented in the same manner as in the first to third embodiments. Namely, the surface of the substrate 600 is thermally oxidized at a temperature of 900 degrees to form an oxide film 602 having a thickness of 500 Å to form a silicon nitride film 603 by CVD process on the surface of the oxide film 602 (FIG. 6A).

Then, silicon nitride film 603 on the memory element side and that on the logic element side are subjected to patterning by using the photolithographic process to form a silicon nitride film 603a from which the portion where a field inversion preventive layer is to be formed is removed. Then, a resist film 604 is formed only on the memory element side.

Subsequently, using the resist film 604 and the silicon nitride film 603a as a mask, boron (B) ions are implanted at a dose of $3 \times 10^{13}$ atoms/cm$^2$ to form a field inversion preventive layer 605a on the logic element side (FIG. 6B).

The resist film 604 is then removed once to form a resist film 604a only on the logic element side.

Using the resist film 604a and the silicon nitride film 603a as a mask, boron (B) ions are implanted at a dose of $1.5 \times 10^{13}$ atoms/cm$^2$ (FIG. 6C) to first form a field inversion preventive layer 605b having a low impurity concentration on the memory element side.

After the resist film 604a is removed, a resist is coated on the entire surface. Then, patterning is implemented so that the resist portion only on the central portion which does not adjoin elements of the field inversion preventive layer on the memory element side is removed to form a resist film 604b.

Using the resist film 604b as a mask, boron (B) ions are implanted at a dose of $5 \times 10^{13}$ atoms/cm$^2$ (FIG. 6D) to increase the impurity concentration of the central portion 605c.

At times subsequent thereto, in the same manner as in the above-described first and second embodiments, a field oxide film 606 having a thickness of 4000 to 6000 Å is formed within the device isolation region (FIG. 6E) to remove therefrom the silicon oxide film 603a thereafter to form an EEPROM and a CPU within the device formation region 607 on the memory element side and that on the logic element side, respectively (FIG. 6F).

As stated above, the semiconductor device is formed in a manner that the field inversion preventive layer on the logic element side and that on the memory element side have impurity concentrations different from each other. In the case of the field inversion preventive layer on the logic element side, this layer is formed so that it has a relatively low concentration impurity to prevent an unnecessary electric capacitor from being formed, thereby making it possible to prevent lowering of the operating speed.

Figure 8:
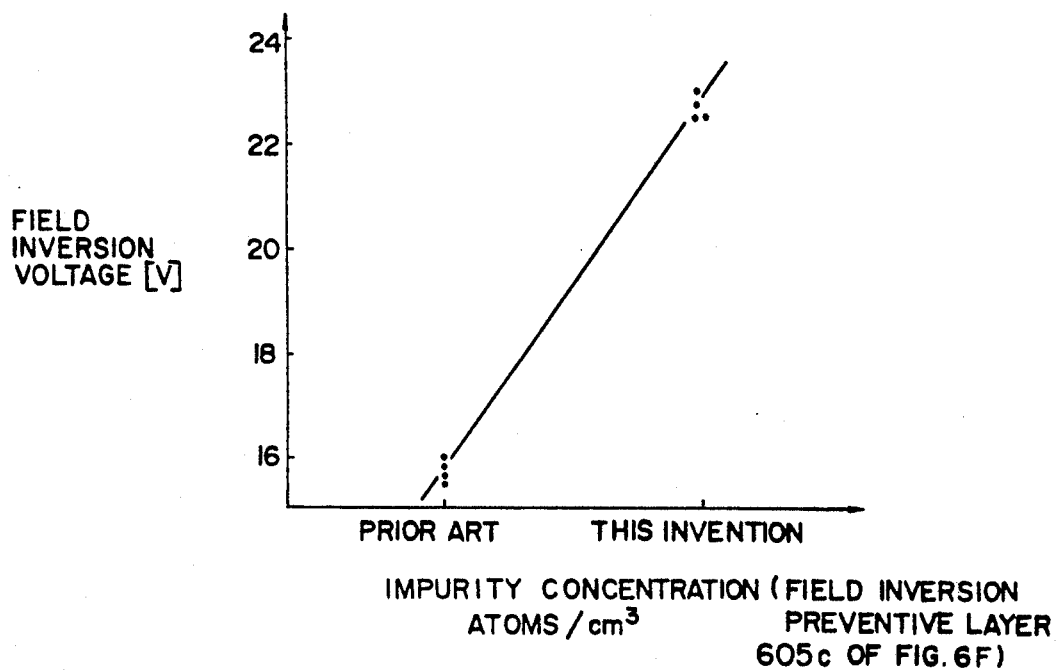
FIG. 8 is an explanatory view showing the relationship between the impurity concentration and the field inversion voltage of the memory element in the semiconductor device of this invention.
Figure 9:
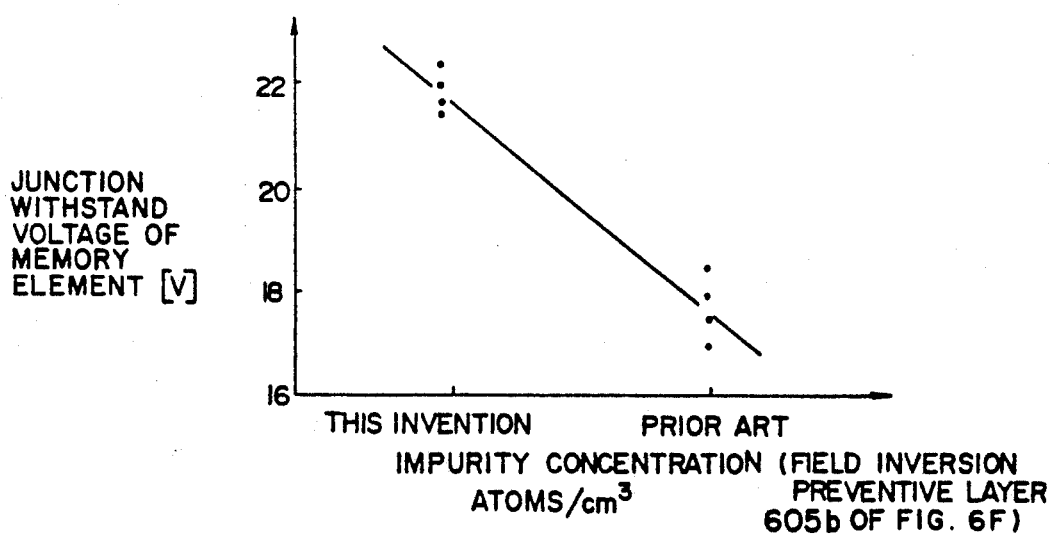
FIG. 9 is an explanatory view showing the relationship between the impurity concentration and the junction withstand voltage in the semiconductor device of this invention.

On the other hand, the field inversion preventive layer on the memory element side can be formed so that the portion adjoining the device formation region and the portion which does not adjoin it have concentrations different from each other. In this instance, the portion which does not adjoin the device formation region is formed so that it has an impurity concentration higher than that in the prior art. As seen from FIG. 8 showing the relationship between the field inversion voltage and the impurity concentration, a higher field inversion voltage can be thus provided. For this reason, even in the case where a high voltage is used, field inversion phenomenon can be prevented and the memory capacity of the memory element can be increased. In addition, by forming the portion adjoining the device formation region so that it has an impurity concentration lower than that of the field inversion preventive layer on the logic element side, the junction withstand voltage can be improved as compared to that of the prior art as seen from FIG. 9 showing the relationship between the junction withstand voltage and the impurity concentration.

The above-described embodiments may be modified or altered in various forms.

For example, in connection with the conductivity type of the semiconductor, conductivity types illustrated in the embodiments may be entirely reversed, respectively. In addition, the sequence of the process steps for implanting boron (B) ions may be different from that illustrated in FIG. 6. Namely, the process step for ion-implantation into the region on the logic element side shown in FIG. 6B and the process step for ion-implantation into the region on the memory element side shown in FIG. 6C may be carried out in reverse order.

What is claimed is:

1. A semiconductor device including a plurality of logic elements and memory elements formed on the same substrate,
said semiconductor device comprising:
   a region where said logic elements are formed, including a first field inversion preventive layer having a first impurity concentration below a first field oxide film for isolating one of said logic elements from neighboring logic elements; and
   a region where said memory elements are formed, including a second field inversion preventive layer below a second field oxide film for isolating one of said memory elements from neighboring memory elements, said second field inversion preventive layer having a second impurity concentration higher than said first impurity concentration at a portion which does not adjoin an active region which is a region surrounded by said second field oxide film, and having a third impurity concentration lower than said first impurity concentration at a portion adjoining said active region.

* * * * *